(12) United States Patent
Liu et al.

(10) Patent No.: US 12,560,666 B2
(45) Date of Patent: Feb. 24, 2026

(54) EPI DATA CORRECTION METHOD AND DEVICE AND MRI SYSTEM

(71) Applicant: Siemens Healthineers AG, Forchheim (DE)

(72) Inventors: Wei Liu, Erlangen (DE); Kun Zhou, Shenzhen (CN); Nan Xiao, Shenzhen (CN); Simon Bauer, Baunach (DE); Adam Kettinger, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 195 days.

(21) Appl. No.: 18/583,938

(22) Filed: Feb. 22, 2024

(65) Prior Publication Data

US 2024/0288527 A1　　Aug. 29, 2024

(30) Foreign Application Priority Data

Feb. 27, 2023　(CN) .......................... 202310216284.7

(51) Int. Cl.
　G01R 33/565 (2006.01)
　G01R 33/561 (2006.01)
(52) U.S. Cl.
　CPC ... G01R 33/56554 (2013.01); G01R 33/5616 (2013.01)
(58) Field of Classification Search
　CPC .......... G01R 33/56554; G01R 33/5616; G01R 33/5611
　USPC ....................................................... 324/309
　See application file for complete search history.

(56) References Cited

U.S. PATENT DOCUMENTS

| | | | | | |
|---|---|---|---|---|---|
| 5,672,969 | A | * | 9/1997 | Zhou | G01R 33/56572 |
| | | | | | 324/309 |
| 7,403,002 | B2 | * | 7/2008 | Feiweier | G01R 33/5616 |
| | | | | | 324/307 |
| 10,495,717 | B2 | | 12/2019 | Hoge et al. | |
| 11,754,653 | B1 | * | 9/2023 | Chang | G01R 33/5616 |
| | | | | | 324/309 |

(Continued)

OTHER PUBLICATIONS

Hoge, W. Scott, and Jonathan R. Polimeni. "A dual-polarity GRAPPA kernel for the robust reconstruction of accelerated EPI data." 2015 IEEE 12th International Symposium on Biomedical Imaging (ISBI). IEEE, 2015. (Year: 2015).*

(Continued)

*Primary Examiner* — Christopher P McAndrew
(74) *Attorney, Agent, or Firm* — Banner & Witcoff, Ltd.

(57) ABSTRACT

Techniques are provided for performing echo planar imaging (EPI) data correction. This includes obtaining positive and negative readout gradient calibration data of an imaging target through non-accelerated EPI acquisitions; respectively adopting first and second DPG kernels to be fitted and respectively used to eliminate phase errors of positive and negative readout gradients to fit the positive and negative readout gradient calibration data of the imaging target, with the fitting targets being positive and negative readout gradient data, respectively, in ghost-free target ACS data, and obtaining, after the fitting, a first and a second DPG kernel for final use; obtaining imaging data of the imaging target through an EPI acquisition; adopting the first and second DPG kernels to correct the phase errors of the imaging data to obtain phase-error-free imaging data.

21 Claims, 5 Drawing Sheets

100

(56) References Cited

U.S. PATENT DOCUMENTS

| | | | |
|---|---|---|---|
| 2001/0008376 A1* | 7/2001 | Mock | G01R 33/56554 |
| | | | 324/309 |
| 2011/0234221 A1 | 9/2011 | Feiweier | |
| 2017/0038450 A1* | 2/2017 | Hoge | G01R 33/4835 |
| 2017/0089999 A1* | 3/2017 | Zeller | G01R 33/5616 |
| 2017/0276755 A1* | 9/2017 | Hoge | G01R 33/5611 |
| 2018/0017655 A1* | 1/2018 | Zeller | G01R 33/4835 |

OTHER PUBLICATIONS

Hoge, W. Scott, and Jonathan R. Polimeni. "Dual-polarity GRAPPA for simultaneous reconstruction and ghost correction of echo planar imaging data." Magnetic resonance in medicine 76.1 (2016): 32-44. (Year: 2015).*
Lobos, Rodrigo A., et al. "Navigator-free EPI ghost correction with structured low-rank matrix models: New theory and methods." IEEE transactions on medical imaging 37.11 (2018): 2390-2402. (Year: 2018).*
Lobos, Rodrigo A., et al. "Robust autocalibrated structured low-rank EPI ghost correction." Magnetic resonance in Medicine 85.6 (2021): 3403-3419. (Year: 2021).*
Bruder, H, et al., "Image Reconstruction for Echo Planar Imaging with Nonequidistant k-Space Sampling", 1992, Magnetic Resonance in Medicine, 1992, 39:606-614, 13 pages; 1992.
Hoge W. Scott, et al. "Dual-Polarity GRAPPA for Simultaneous Reconstruction and Ghost Correction of Echo Planar Imaging Data" Magnetic Resonance in Medicine, 2016, 76:32-44, 32 pages; 2016.
Hoge W. S. et al., "Robust EPI Nyquist Ghost Elimination via Spatial and Temporal Encoding"; Magnetic Resonance in Medicine; vol. 64; pp. 1781-1791; 2010.

* cited by examiner

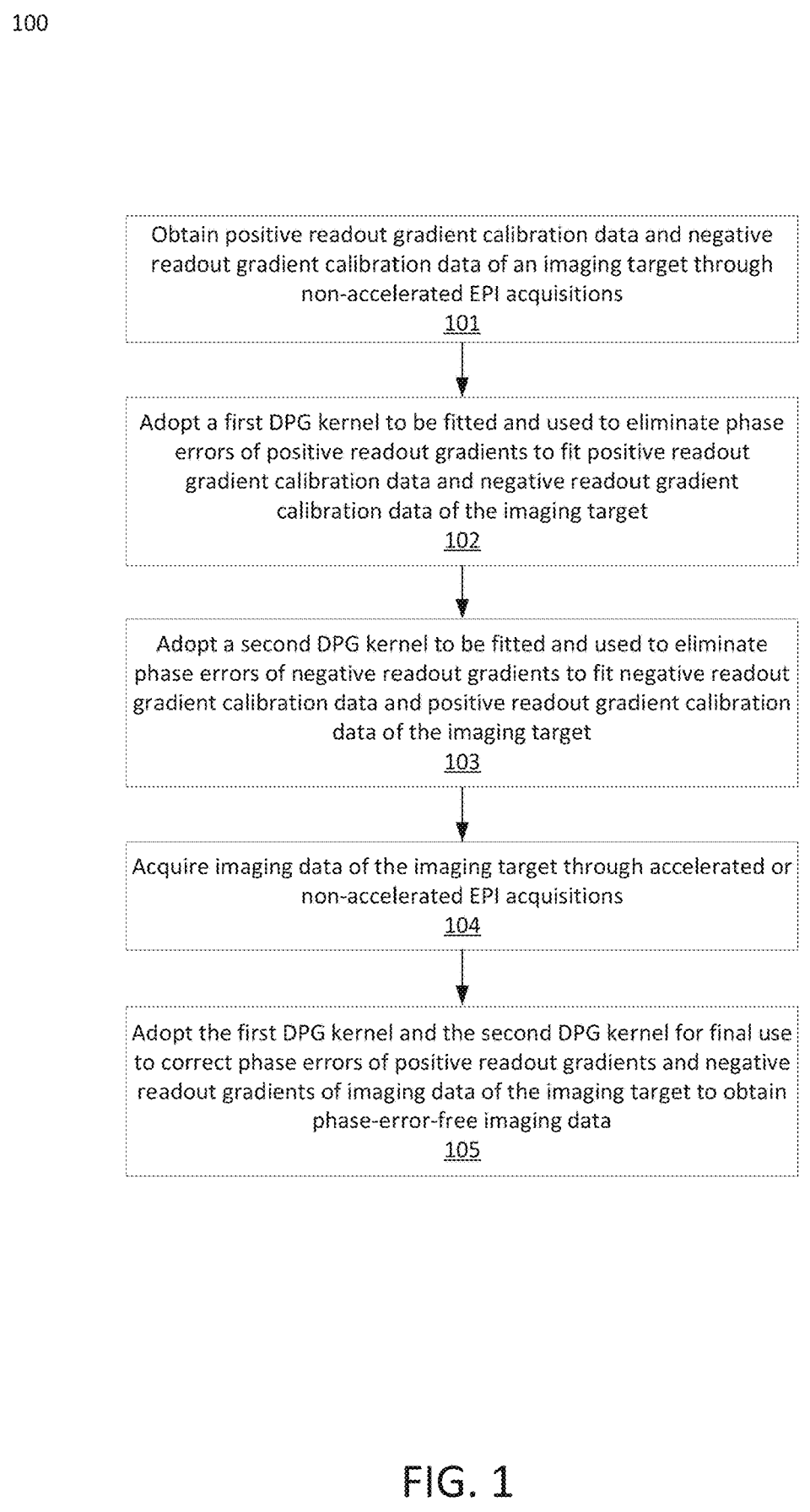

100

Obtain positive readout gradient calibration data and negative
readout gradient calibration data of an imaging target through
non-accelerated EPI acquisitions
101

Adopt a first DPG kernel to be fitted and used to eliminate phase
errors of positive readout gradients to fit positive readout
gradient calibration data and negative readout gradient
calibration data of the imaging target
102

Adopt a second DPG kernel to be fitted and used to eliminate
phase errors of negative readout gradients to fit negative readout
gradient calibration data and positive readout gradient calibration
data of the imaging target
103

Acquire imaging data of the imaging target through accelerated or
non-accelerated EPI acquisitions
104

Adopt the first DPG kernel and the second DPG kernel for final use
to correct phase errors of positive readout gradients and negative
readout gradients of imaging data of the imaging target to obtain
phase-error-free imaging data
105

FIG. 1

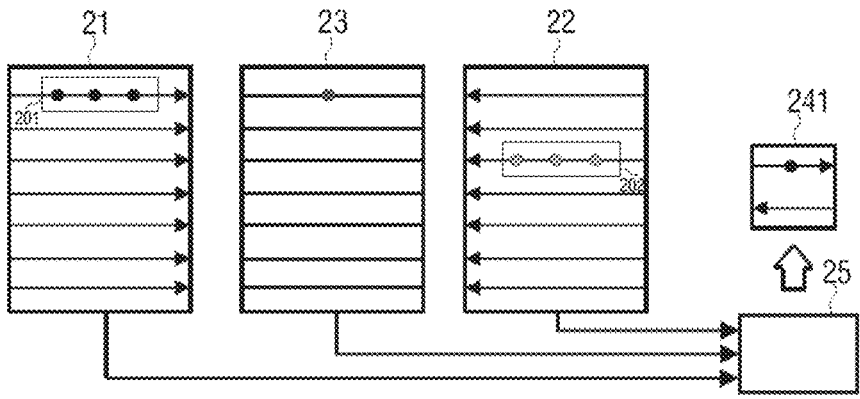
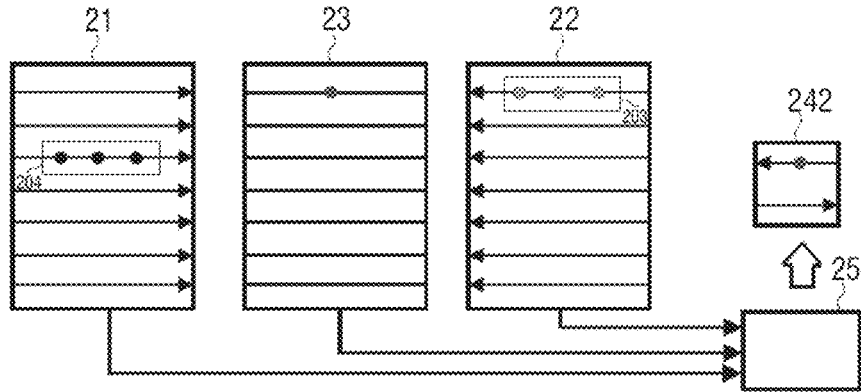
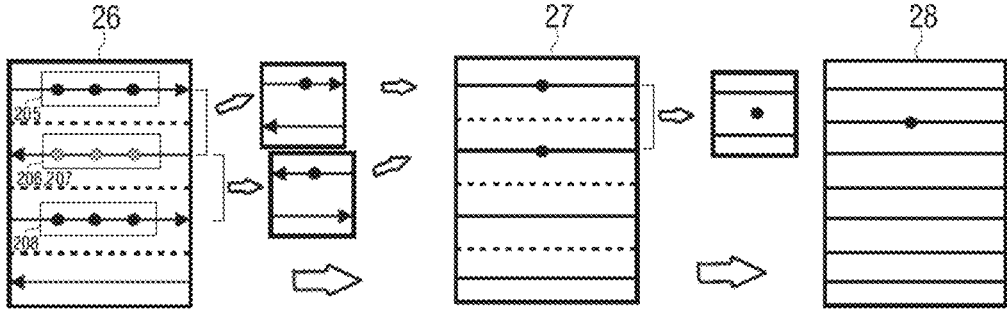
Fig. 2

EPI DATA CORRECTION METHOD AND DEVICE AND MRI SYSTEM

CROSS-REFERENCE TO RELATED APPLICATIONS

The present application claims priority to and the benefit of is China Patent Application no. CN 202310216284.7, filed Feb. 27, 2023, the contents of which are incorporated herein by reference in their entirety.

TECHNICAL FIELD

The present disclosure relates to the technical field of MRI and, in particular, to an EPI data correction method and device and an MRI system.

BACKGROUND

Echo-planar imaging (EPI) is a common method of functional activity, diffusion, and perfusion MRI. EPI realizes high-efficiency acquisitions by sampling k-space having alternating echoes through fast switched positive and negative readout gradients. Therefore, a small inconsistency caused by a gradient hardware defect or eddy between odd and even k-space lines will lead to a well-known image ghost-Nyquist ghost. Based on calibration data acquired without any phase encoding gradient, the traditional Nyquist Ghost Correction (NGC) method can process only zero-order and first-order phase errors (for example, scalar phase error and linear phase error) between data acquired by positive and negative readout gradients. Since high-order phase errors caused by a space-related eddy effect possibly cannot be effectively eliminated, a residual ghost will be caused.

The Ghost Elimination via Spatial and Temporal Encoding (GESTE) method is an NGC method and uses the Generalized Autocalibrating Partially Parallel Acquisitions (GRAPPA)-based reconstruction method for non-accelerated single-shot EPI data, wherein each EPI data frame is divided into two sub-frames: one sub-frame has a positive readout gradient (RO+), and the other sub-frame has a negative readout gradient (RO−). After missing k-space lines in each sub-frame are reconstructed by use of the GRAPPA-based reconstruction method, the final phase-error-free image can be obtained by combining two reconstructed sub-frames. If the acceleration factor is not too high, the GESTE method can also be used for accelerated EPI acquisitions (namely, under-sampled EPI acquisitions), but the effective acceleration factor will be doubled after the imaging data is divided into sub-frames.

To expand the application of the GESTE method, the Dual-Polarity GRAPPA (DPG) method, which corrects residual ghosts in accelerated EPI data by estimating missing k-space lines and correcting inherent phase errors between odd and even k-space lines, has been adopted. Compared with the traditional GRAPPA-based reconstruction method, the DPG method requires a plurality of DPG kernels to match different modes formed by unprocessed RRO+ and RO− EPI data and target autocalibration signal (ACS) data.

The ghost correction step in the DPG method is embedded into the GRAPPA-based reconstruction method. This means that the DPG method can be used to obtain phase-error-free missing k-space lines from adjacent imaging lines and meanwhile obtain phase-error-free imaging k-space lines. This also means that it is not easy to integrate the DPG method into other accelerated imaging reconstruction methods like a reconstruction method based on sensitivity encoding and a reconstruction method based on deep learning.

SUMMARY

In view of this, embodiments of the present disclosure provide an EPI data correction method and device on the one hand to realize decoupling between a phase error correction process and a missing k-space line estimation process of EPI data on the basis of corrections of low-order and high-order phase errors in EPI data so as to expand the application scenarios of EPI, and provide an MRI system on the other hand to realize decoupling between a phase error correction process and a missing k-space line estimation process of EPI data on the basis of corrections of low-order and high-order phase errors in EPI data so as to expand the application scenarios of EPI.

An EPI data correction method comprises:

obtaining positive readout gradient calibration data and negative readout gradient calibration data of an imaging target through non-accelerated EPI acquisitions;

adopting a first DPG kernel to be fitted and used to eliminate phase errors of positive readout gradients to fit positive readout gradient calibration data and negative readout gradient calibration data of an imaging target, with the fitting target being positive readout gradient target ACS data in ghost-free target ACS data, and obtaining, after the fitting, the first DPG kernel for final use;

adopting a second DPG kernel to be fitted and used to eliminate phase errors of negative readout gradients to fit the negative readout gradient calibration data and positive readout gradient calibration data of the imaging target, with the fitting target being negative readout gradient target ACS data in ghost-free target ACS data, and obtaining, after the fitting, a second DPG kernel for final use;

obtaining imaging data of the imaging target through accelerated or non-accelerated EPI acquisitions;

adopting the first DPG kernel and the second DPG kernel for final use to correct phase errors of positive readout gradients and negative readout gradients for imaging data of the imaging target to obtain phase-error-free imaging data.

If imaging data of the imaging target, obtained through accelerated or non-accelerated EPI acquisitions, is obtained through accelerated EPI acquisitions, after obtaining the phase-error-free imaging data, the method further comprises:

performing missing k-space line estimation processing for the phase-error-free imaging data to obtain phase-error-free and missing-k-space-line-free imaging data.

Performing missing k-space line estimation processing for the phase-error-free imaging data comprises:

adopting a parallel reconstruction method or a reconstruction method based on deep learning to perform missing k-space line estimation processing for the phase-error-free imaging data.

When the parallel reconstruction method is a GRAPPA-based reconstruction method, the GRAPPA kernel adopted for the GRAPPA-based reconstruction method is obtained by fitting the ghost-free target ACS data;

when the parallel reconstruction method is a reconstruction method based on sensitivity encoding, the coil sensitivity map in the reconstruction method based on sensitivity encoding is obtained by adopting the ghost-free target ACS data for calculations.

When the reconstruction method based on deep learning is adopted to perform missing k-space line estimation processing for the phase-error-free imaging data, calibration data adopted for the deep learning network in the reconstruction method based on deep learning is the ghost-free target ACS data.

Adopting a first DPG kernel to be fitted and used to eliminate phase errors of positive readout gradients to fit positive readout gradient calibration data and negative readout gradient calibration data of the imaging target comprises:

performing the following step A1 for positive readout gradient calibration data and negative readout gradient calibration data of each channel of the imaging target:

A1: set two sliding windows with a length of n and a sliding step of 1, and synchronously slide the two sliding windows on positive readout gradient calibration data in line m of the current channel and negative readout gradient calibration data in line m+R; when the positions of the two sliding windows are changed, adopt the coefficient of the corresponding channel of the first DPG kernel to fit 2n pieces of data in the two sliding windows, and obtain a fitting equation after the fitting, wherein n is an integer greater than 1, m is an integer greater than or equal to 1, and R is an acceleration factor in an intra-layer phase direction;

after performing step A1 for positive readout gradient calibration data and negative readout calibration data of all channels of the imaging target, solve all fitting equations to obtain all coefficients of all channels of the first DPG kernel.

Adopting a second DPG kernel to be fitted and used to eliminate phase errors of negative readout gradients to fit negative readout gradient calibration data and positive readout gradient calibration data of the imaging target comprises:

performing the following step A2 for negative readout gradient calibration data and positive readout gradient calibration data of each channel of the imaging target:

A2: set two sliding windows with a length of n and a sliding step of 1, and synchronously slide the two sliding windows on negative readout gradient calibration data in line m of the current channel and positive readout gradient calibration data in line m+R; when the positions of the two sliding windows are changed, adopt the coefficient of the corresponding channel of the second DPG kernel to fit 2n pieces of data in the two sliding windows, with the fitting target being data in the corresponding position in line m in ghost-free target ACS data of the corresponding channel, and obtain a fitting equation after the fitting, wherein n is an integer greater than 1, m is an integer greater than or equal to 1, and R is an acceleration factor in an intra-layer phase direction;

after performing step A2 for negative readout gradient calibration data and positive readout calibration data of all channels of the imaging target, solve all fitting equations to obtain all coefficients of all channels of the second DPG kernel.

Adopting the first DPG kernel and the second DPG kernel for final use to correct phase errors of positive readout gradients and negative readout gradients for imaging data of the imaging target comprises:

performing the following steps B1 and B2 for imaging data of each channel of the imaging target:

B1: set two sliding windows with a length of n and a sliding step of 1, and synchronously slide the two sliding windows on positive readout gradient imaging data in line m of the current channel and negative readout gradient imaging data in line m+1; when the positions of the two sliding windows are changed, adopt the first DPG kernel for final use to perform weighted averaging operations for 2n pieces of data in the two sliding windows to obtain ghost-free imaging data in the corresponding position in line m of the corresponding channel, wherein n is an integer greater than 1 and m is an integer greater than or equal to 1;

B2: set two sliding windows with a length of n and sliding step of 1, and synchronously slide the two sliding windows on negative readout gradient imaging data in line m+1 of the current channel and positive readout gradient imaging data in line m+2; when the positions of the two sliding windows are changed, adopt the second DPG kernel for final use to perform weighted averaging operations for 2n pieces of data in the two sliding windows to obtain ghost-free data in the corresponding position in line m+1 of the corresponding channel;

after performing steps B1 and B2 for imaging data of all channels of the imaging target, obtain ghost-free imaging data of all channels of the imaging target.

After obtaining positive readout gradient calibration data and negative readout calibration data of the imaging target through non-accelerated EPI acquisitions, but before adopting a first DPG kernel to be fitted and used to eliminate phase errors of positive readout gradients to fit positive readout gradient calibration data and negative readout gradient calibration data of the imaging target, the method further comprises:

performing phase error elimination processing for positive readout gradient calibration data and negative readout gradient calibration data of the imaging target to obtain ghost-free target ACS data.

Performing phase error elimination processing for positive readout gradient calibration data and negative readout gradient calibration data of the imaging target comprises:

adopting the GESTE method to perform phase error elimination processing for positive readout gradient calibration data and negative readout gradient calibration data of the imaging target.

An EPI data correction device comprises:

a calibration data acquisition module, configured to obtain positive readout gradient calibration data and negative readout gradient calibration data of an imaging target through non-accelerated EPI acquisitions;

a DPG kernel acquisition module, configured to adopt a first DPG kernel to be fitted and used to eliminate phase errors of positive readout gradients to fit positive readout gradient calibration data and negative readout gradient calibration data of the imaging target, with the fitting target being positive readout gradient target ACS data in ghost-free target ACS data, and obtain the first DPG kernel, after the fitting, for final use; adopt a second DPG kernel to be fitted and used to eliminate phase errors of negative readout gradients to fit negative readout gradient calibration data and positive readout gradient calibration data of the imaging target, with the fitting target being negative readout gradient target ACS data in ghost-free target ACS data, and obtain, after the fitting, the second DPG kernel for final use;

an imaging data acquisition module, configured to obtain imaging data of the imaging target through accelerated or non-accelerated EPI acquisitions;

a correction module, configured to adopt the first DPG kernel and the second DPG kernel for final use to correct phase errors of positive readout gradients and negative readout gradients of imaging data of the imaging target to obtain phase-error-free imaging data.

When the imaging data acquisition module obtains imaging data of the imaging target through accelerated EPI acquisitions, the device further comprises a missing line estimation module, configured to perform missing k-space line estimation processing for the phase-error-free imaging data to obtain phase-error-free and missing-k-space-line-free imaging data.

The missing line estimation module performing missing k-space line estimation processing for the phase-error-free imaging data comprises:

adopting a parallel reconstruction method or a reconstruction method based on deep learning to perform missing k-space line estimation processing for the phase-error-free imaging data.

When the parallel reconstruction method adopted by the missing line estimation module is a GRAPPA-based reconstruction method, the GRAPPA kernel adopted for the GRAPPA-based reconstruction method is obtained by fitting the ghost-free target ACS data;

when the parallel reconstruction method adopted by the missing line estimation module is a reconstruction method based on sensitivity encoding, the coil sensitivity map in the reconstruction method based on sensitivity encoding is obtained by adopting the ghost-free target ACS data for calculations.

When the missing line estimation module adopts the reconstruction method based on deep learning to perform missing k-space line estimation processing for the phase-error-free imaging data, calibration data adopted for the deep learning network in the reconstruction method based on deep learning is the ghost-free target ACS data.

The DPG kernel acquisition module adopting a first DPG kernel to be fitted and used to eliminate phase errors of positive readout gradients to fit positive readout gradient calibration data and negative readout gradient calibration data of the imaging target comprises:

performing the following step A1 for positive readout gradient calibration data and negative readout gradient calibration data of each channel of the imaging target:

A1: set two sliding windows with a length of n and a sliding step of 1, and synchronously slide the two sliding windows on positive readout gradient calibration data in line m of the current channel and negative readout gradient calibration data in line m+R; when the positions of the two sliding windows are changed, adopt the coefficient of the corresponding channel of the first DPG kernel to fit 2n pieces of data in the two sliding windows, and obtain a fitting equation after the fitting, wherein n is an integer greater than 1, m is an integer greater than or equal to 1, and R is an acceleration factor in an intra-layer phase direction;

after performing step A1 for positive readout gradient calibration data and negative readout calibration data of all channels of the imaging target, solve all fitting equations to obtain all coefficients of all channels of the first DPG kernel.

The DPG kernel acquisition module adopting a second DPG kernel to be fitted and used to eliminate phase errors of negative readout gradients to fit negative readout gradient calibration data and positive readout gradient calibration data of the imaging target comprises:

performing the following step A2 for negative readout gradient calibration data and positive readout gradient calibration data of each channel of the imaging target:

A2: set two sliding windows with a length of n and a sliding step of 1, and synchronously slide the two sliding windows on negative readout gradient calibration data in line m of the current channel and positive readout gradient calibration data in line m+R; when the positions of the two sliding windows are changed, adopt the coefficient of the corresponding channel of the second DPG kernel to fit 2n pieces of data in the two sliding windows, with the fitting target being data in the corresponding position in line m in ghost-free target ACS data of the corresponding channel, and obtain a fitting equation after the fitting, wherein n is an integer greater than 1, m is an integer greater than or equal to 1, and R is an acceleration factor in an intra-layer phase direction;

after performing step A2 for negative readout gradient calibration data and positive readout calibration data of all channels of the imaging target, solve all fitting equations to obtain all coefficients of all channels of the second DPG kernel.

The correction module adopting the first DPG kernel and the second DPG kernel for final use to correct phase errors of positive readout gradients and negative readout gradients of the imaging target comprises:

performing the following steps B1 and B2 for imaging data of each channel of the imaging target:

B1: set two sliding windows with a length of n and a sliding step of 1, and synchronously slide the two sliding windows on positive readout gradient imaging data in line m of the current channel and negative readout gradient imaging data in line m+1; when the positions of the two sliding windows are changed, adopt the first DPG kernel for final use to perform weighted averaging operations for 2n pieces of data in the two sliding windows to obtain ghost-free imaging data in the corresponding position in line m of the corresponding channel, wherein n is an integer greater than 1 and m is an integer greater than or equal to 1;

B2: set two sliding windows with a length of n and sliding step of 1, and synchronously slide the two sliding windows on negative readout gradient imaging data in line m+1 of the current channel and positive readout gradient imaging data in line m+2; when the positions of the two sliding windows are changed, adopt the second DPG kernel for final use to perform weighted averaging operations for 2n pieces of data in the two sliding windows to obtain ghost-free data in the corresponding position in line m+1 of the corresponding channel;

after performing steps B1 and B2 for imaging data of all channels of the imaging target, obtain ghost-free imaging data of all channels of the imaging target.

The device further comprises a ghost-free calibration data acquisition module, configured to perform phase error elimination processing for positive readout gradient calibration data and negative readout gradient calibration data of the imaging target to obtain ghost-free target ACS data.

The ghost-free calibration data acquisition module performing phase error elimination processing for positive readout gradient calibration data and negative readout gradient calibration data of the imaging target comprises:

7 adopting the GESTE method to perform phase error elimination processing for positive readout gradient calibration data and negative readout gradient calibration data of the imaging target.

An MRI system comprises the EPI data correction device mentioned above.

In embodiments of the present disclosure, by fitting positive readout gradient calibration data and negative readout gradient calibration data, obtained through non-accelerated EPI acquisitions of an imaging target and ghost-free target ACS data, first and second DPG kernels used to eliminate phase errors of positive and negative readout gradients are obtained, and the first and second DPG kernels are adopted to correct phase errors of the acquired imaging data. Thus, not only low-order and high-order phase errors in EPI data can be corrected, but also decoupling between a phase error correction process and a missing k-space line estimation process of EPI data is realized, and the application scenarios of EPI are expanded.

BRIEF DESCRIPTION OF THE DRAWINGS

Preferred embodiments of the present disclosure are described in detail below with reference to the drawings, to give those skilled in the art a clearer understanding of the above-mentioned and other features and advantages of the present disclosure. In the figures:

FIG. 1 illustrates a flowchart of an example EPI data correction method provided by embodiments of the present disclosure;

FIG. 2 illustrates an example diagram of a first DPG kernel and a second DPG kernel obtained through fitting, and a phase error correction and a missing k-space line estimation for imaging data provided by embodiments of the present disclosure;

Figure 3:
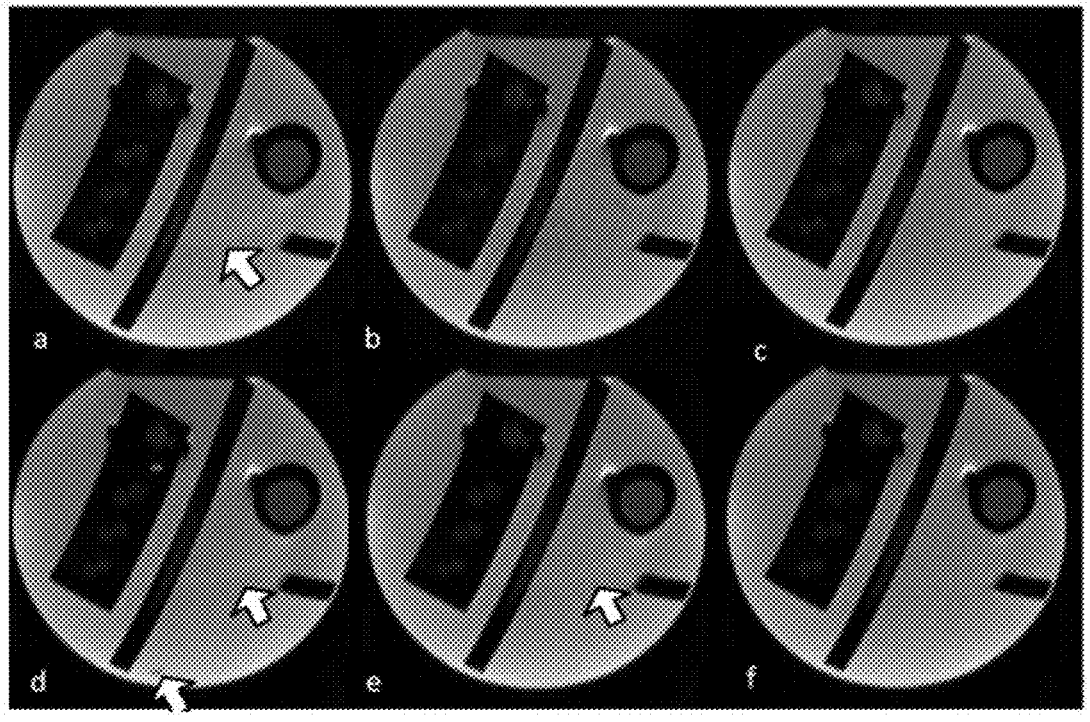
FIG. 3 illustrates an example diagram of images obtained by adopting different methods to reconstruct acquired accelerated EPI data in a water model verification provided by embodiments of the present disclosure.

The reference numerals in the drawings are as follows:

| Reference numerals | Meaning |
|---|---|
| 101-105 | Block |
| 21 | k-space representation of positive readout gradient calibration data, obtained through non-accelerated EPI acquisitions, of a channel (set to channel p) of an imaging target |
| 22 | k-space representation of negative readout gradient calibration data, obtained through non-accelerated EPI acquisitions, of channel p of an imaging target |
| 23 | k-space representation of ghost-free target ACS data of channel p of an imaging target |
| 24 | k-space representation of some ghost-free ACS data, obtained from fitting, of channel p of an imaging target |
| 25 | Fitting module |

8

-continued

| Reference numerals | Meaning |
|---|---|
| 26 | k-space representation of imaging data, obtained through accelerated EPI acquisitions, of channel p of an imaging target |
| 27 | k-space representation of imaging data after a phase error correction |
| 28 | k-space representation of phase-error-free and missing-k-space-line-free imaging data |
| 201-208 | Sliding window |
| 600 | EPI data correction device |
| 601 | Calibration data acquisition module |
| 602 | DPG kernel acquisition module |
| 603 | Imaging data acquisition module |
| 604 | Correction module |

DETAILED DESCRIPTION OF THE DISCLOSURE

To clarify the objective, technical solution, and advantages of the present disclosure, the present disclosure is explained in further detail below through embodiments.

FIG. 1 illustrates a flowchart of an example EPI data correction method provided by one embodiment of the present disclosure, and the specific procedure is as follows:

Block 101: Obtain positive readout gradient calibration data and negative readout gradient calibration data of an imaging target through non-accelerated EPI acquisitions.

Specifically, first acquire alternating calibration data of fully-sampled positive and negative readout gradients of the imaging target through alternating positive and negative readout gradients, that is to say, the first line is positive readout gradient calibration data, the second line is negative readout gradient calibration data, the third line is positive readout gradient calibration data, the fourth line is negative readout gradient calibration data, . . . , and so on; then acquire alternating calibration data of fully-sampled negative and positive readout gradients of the imaging target through alternating negative and positive readout gradients, that is to say, the first line is negative readout gradient calibration data, the second line is positive readout gradient calibration data, the third line is negative readout gradient calibration data, the fourth line is positive readout gradient calibration data, and so on; merge all positive readout gradient calibration data acquired in the two acquisition processes in sequence to obtain the positive readout gradient calibration data of the imaging target in block 101, wherein the merging sequence is: positive readout gradient calibration data in the first line in the first acquisition process, positive readout gradient calibration data in the second line in the second acquisition process, positive readout gradient calibration data in the third line in the first acquisition process, positive readout gradient calibration data in the fourth line in the second acquisition process, . . . , and so on; meanwhile, merge all negative readout gradient calibration data acquired in the two acquisition processes in sequence to obtain negative readout gradient calibration data of the imaging target in block 101, wherein the merging sequence is: negative readout gradient calibration data in the first line in the second acquisition process, negative readout gradient calibration data in the second line in the first acquisition process, negative readout gradient calibration data in the third line in the second acquisition process, negative readout gradient calibration data in the fourth line in the first acquisition process, . . . , and so on.

Block 102: adopt a first DPG kernel to be fitted and used to eliminate phase errors of positive readout gradients to fit positive readout gradient calibration data and negative readout gradient calibration data of the imaging target, with the fitting target being positive readout gradient target ACS data in the ghost-free target ACS data, and obtain, after the fitting, the first DPG kernel for final use.

Wherein, positive readout gradient target ACS data in the ghost-free target ACS data refers to data in the position corresponding to positive readout gradient calibration data of the imaging target in the ghost-free target ACS data. For example, if the first DPG kernel is currently adopted to fit $q+1$ to $q+a$ ($q \geq 0$, $a>1$) pieces of positive readout gradient calibration data in line m ($m \geq 1$) of any channel p ($p \geq 1$) of the imaging target and $q+1$ to $q+a$ pieces of negative readout gradient calibration data in line m+R, the fitting target can be $q+b$ pieces of data in line m in the ghost-free target ACS data, wherein b is usually an intermediate value between 1 and a, and if the intermediate value between 1 and a is not an integer, it can be rounded up or down. Wherein, R is an acceleration factor in an intra-layer phase direction.

In an alternative embodiment, ghost-free target ACS data is obtained by performing the following: perform phase error elimination processing for positive readout gradient calibration data and negative readout gradient calibration data of the imaging target to obtain ghost-free target ACS data. The step is performed before block 101 and block 102.

In an alternative embodiment, performing phase error elimination processing for positive readout gradient calibration data and negative readout gradient calibration data of the imaging target comprises: adopting the GESTE method to perform phase error elimination processing for positive readout gradient calibration data and negative readout gradient calibration data of the imaging target.

Block 103: adopt a second DPG kernel to be fitted and used to eliminate phase errors of negative readout gradients to fit negative readout gradient calibration data and positive readout gradient calibration data of the imaging target, with the fitting target being negative readout gradient target ACS data in ghost-free target ACS data, and obtain, after the fitting, the second DPG kernel for final use.

Wherein, negative readout gradient target ACS data in ghost-free target ACS data refers to data in the position corresponding to negative readout gradient calibration data of the imaging target in the ghost-free target ACS data. For example, if the second DPG kernel is currently adopted to fit $q+1$ to $q+a$ ($q \geq 0$, $a>1$) pieces of negative readout gradient calibration data in line m ($m \geq 1$) of any channel p ($p \geq 1$) of the imaging target and $q+1$ to $q+a$ pieces of positive readout gradient calibration data in line m+R, the fitting target can be $q+b$ pieces of data in line m in the ghost-free target ACS data, wherein b is usually an intermediate value between 1 and a, and if the intermediate value between 1 and a is not an integer, it can be rounded up or down. Wherein, R is an acceleration factor in an intra-layer phase direction.

Wherein, the first DPG kernel and the second DPG kernel are both a DPG kernel and are essentially a coefficient matrix. These can be constructed by adopting a prior DPG kernel construction method. The size of the first DPG kernel and the second DPG kernel can be set according to experience.

Fitting algorithms are a prior mature technology and the specific fitting algorithm adopted in embodiments of the present disclosure is not restricted.

Block 104: acquire imaging data of the imaging target through accelerated or non-accelerated EPI acquisitions.

Block 105: adopt the first DPG kernel and the second DPG kernel for final use to correct phase errors of positive readout gradients and negative readout gradients of imaging data of the imaging target to obtain phase-error-free imaging data.

In an alternative embodiment, in order to further improve the phase error correction effect, after block 104 but before block 105, the method comprises: adopting the traditional NGC method to correct zero-order and first-order phase errors for acquired imaging data. After that, in block 105, adopt the first kernel and the second kernel for final use to correct phase errors of positive readout gradients and negative readout gradients for imaging data for which zero-order and first-order phase errors have been corrected.

In the above-mentioned embodiments, by fitting positive readout gradient calibration data and negative readout gradient calibration data, obtained through non-accelerated EPI acquisitions of an imaging target and ghost-free target ACS data, first and second DPG kernels used to eliminate phase errors of positive and negative readout gradients are obtained, and the first and second DPG kernels are adopted to correct phase errors of the acquired imaging data. Thus, not only low-order and high-order phase errors in EPI data can be corrected, but also decoupling between a phase error correction process and a missing k-space line estimation process of EPI data is realized, and the application scenarios of EPI are expanded.

After phase errors are corrected for imaging data, missing k-space lines in imaging data can be estimated.

In an alternative embodiment, if imaging data, obtained through accelerated or non-accelerated EPI acquisitions, of the imaging target in block 104 is imaging data obtained through accelerated EPI acquisitions, after obtaining phase-error-free imaging data is obtained in block 105, the method further comprises: performing missing k-space line estimation processing for phase-error-free imaging data to obtain phase-error-free and missing-k-space-line-free imaging data.

In an alternative embodiment, performing missing k-space line estimation processing for phase-error-free imaging data comprises adopting a parallel reconstruction method or a reconstruction method based on deep learning to perform missing k-space line estimation processing for phase-error-free imaging data.

When a parallel reconstruction is adopted to perform missing k-space line estimation processing for phase-error-free imaging data, the consistency between imaging data after the phase error correction by use of the NGC method and imaging data after the k-space line reconstruction should be guaranteed during the parallel reconstruction.

In an alternative embodiment, when the parallel reconstruction method is a GRAPPA-based reconstruction method, the GRAPPA kernel adopted for the GRAPPA-based reconstruction method is obtained by fitting the ghost-free target ACS data. In block 102; when the parallel reconstruction method is a reconstruction method based on sensitivity encoding, the coil sensitivity map adopted for the reconstruction method based on sensitivity encoding is obtained by adopting the ghost-free target ACS data for calculations.

When a reconstruction method based on deep learning is adopted to perform missing k-space line estimation processing for phase-error-free imaging data, the consistency between imaging data after the phase error correction by use of the NGC method and imaging data after the k-space line reconstruction should be guaranteed during the reconstruction based on deep learning. In an alternative embodiment, when a reconstruction method based on deep learning is adopted to perform missing k-space line estimation processing for phase-error-free imaging data, calibration data adopted for the deep learning network in the reconstruction method based on deep learning is the ghost-free target ACS data in block 102.

In an optional embodiment, block 102 specifically comprises:

performing the following step A1 for positive readout gradient calibration data and negative readout gradient calibration data of each channel of the imaging target:

A1: set two sliding windows with a length of n and a sliding step of 1, and synchronously slide the two sliding windows on positive readout gradient calibration data in line m of the current channel and negative readout gradient calibration data in line m+R; when the positions of the two sliding windows are changed, adopt the coefficient of the corresponding channel of the first DPG kernel to fit 2n pieces of data in the two sliding windows, and obtain a fitting equation after the fitting, wherein n is an integer greater than 1, m is an integer greater than or equal to 1, and R is an acceleration factor in an intra-layer phase direction;

after performing step A1 for positive readout gradient calibration data and negative readout calibration data of all channels of the imaging target, solve all fitting equations to obtain all coefficients of all channels of the first DPG kernel.

The coefficient matrix formed by all obtained coefficients of all channels is the first DPG kernel for final use.

In an optional embodiment, block 103 specifically comprises:

performing the following step A2 for negative readout gradient calibration data and positive readout gradient calibration data of each channel of the imaging target:

A2: set two sliding windows with a length of n and a sliding step of 1, and synchronously slide the two sliding windows on negative readout gradient calibration data in line m of the current channel and positive readout gradient calibration data in line m+R; when the positions of the two sliding windows are changed, adopt the coefficient of the corresponding channel of the second DPG kernel to fit 2n pieces of data in the two sliding windows, with the fitting target being data in the corresponding position in line m in ghost-free target ACS data of the corresponding channel, and obtain a fitting equation after the fitting, wherein n is an integer greater than 1, m is an integer greater than or equal to 1, and R is an acceleration factor in an intra-layer phase direction;

after performing step A2 for negative readout gradient calibration data and positive readout calibration data of all channels of the imaging target, solve all fitting equations to obtain all coefficients of all channels of the second DPG kernel.

The coefficient matrix formed by all obtained coefficients of all channels is the second DPG kernel for final use.

In an optional embodiment, block 105 specifically comprises:

performing the following steps B1 and B2 for imaging data of each channel of the imaging target:

B1: set two sliding windows with a length of n and a sliding step of 1, and synchronously slide the two sliding windows on positive readout gradient imaging data in line m of the current channel and negative readout gradient imaging data in line m+1; when the positions of the two sliding windows are changed, adopt the first DPG kernel for final use to perform weighted averaging operations for 2n pieces of data in the two sliding windows to obtain ghost-free imaging data in the corresponding position in line m of the corresponding channel, wherein n is an integer greater than 1 and m is an integer greater than or equal to 1;

B2: set two sliding windows with a length of n and sliding step of 1, and synchronously slide the two sliding windows on negative readout gradient imaging data in line m+1 of the current channel and positive readout gradient imaging data in line m+2; when the positions of the two sliding windows are changed, adopt the second DPG kernel for final use to perform weighted averaging operations for 2n pieces of data in the two sliding windows to obtain ghost-free data in the corresponding position in line m+1 of the corresponding channel;

after performing B1 and B2 for imaging data of all channels of the imaging target, obtain ghost-free imaging data of all channels of the imaging target.

FIG. 2 is an example diagram of a first DPG kernel and a second DPG kernel obtained through fitting, and a phase error correction and a missing k-space line estimation for imaging data. In the example, the acceleration factor R in an intra-layer phase direction is 2, the width of the sliding window is n=3, and the sliding step is 1. As shown in FIG. 2, 21 is a k-space representation of positive readout gradient calibration data, obtained through non-accelerated EPI acquisitions, of a channel (set to channel p) of an imaging target, 22 is a k-space representation of negative readout gradient calibration data, obtained through non-accelerated EPI acquisitions, of channel p of an imaging target, 23 is a k-space representation of ghost-free target ACS data of channel p of an imaging target, 241 and 242 are k-space representations of some ghost-free ACS data, obtained from fitting, of channel p of an imaging target, and 25 is a fitting module. Wherein:

two sliding windows 201, 202 with a width of n=3 are synchronously slid on positive readout gradient calibration data in line m (m≥1) of channel p of the imaging target and negative readout gradient calibration data in line m+2 of channel p of the imaging target. As shown in FIG. 2, when the sliding window 201 slides to the position shown in line 1 of 21, the sliding window 201 contains three pieces of calibration data. Meanwhile, the sliding window 202 slides to the position shown in line 3 of 22, and at this time, the sliding window 202 also contains three pieces of calibration data. Adopt the corresponding coefficient of channel p of the first DPG kernel to fit the six pieces of calibration data in the sliding window 201 and the sliding window 202 (that is to say, use the corresponding coefficient of channel p of the first DPG kernel to perform weighted averaging operations for the six pieces of calibration data), with the fitting target being ghost-free target ACS data (as shown by the small gray point in line 1 of 23) in line 1 of 23, whose position is the same as that of calibration data in the intermediate position in the sliding window 201, and obtain a fitting equation after the fitting. The sliding windows 201, 202 slide on 21 and 22 sequentially from left to right and from the top to the bottom. Construct a fitting equation each time the sliding windows slide. After performing the above-mentioned process for all positive and negative readout gradient calibration data of all channels, solve all constructed fitting equations to obtain a matrix consisting of all coefficients, which is the first DPG kernel for final use.

Meanwhile, synchronously slide two sliding windows 203, 204 with a width of n=3 on negative readout gradient calibration data in line m (m≥1) of channel p of the imaging target and positive readout gradient calibration data in line m+2 of channel p of the imaging target. As shown in FIG. 2, when the sliding window 203 slides to the position shown in line 1 of 22, the sliding window 203 contains three pieces of calibration data. Meanwhile, the sliding window 204 slides to the position shown in line 3 of 21, and at this time, the sliding window 204 also contains three pieces of calibration data. Adopt the corresponding coefficient of channel p of the second DPG kernel to fit the six pieces of calibration data in the sliding window 203 and the sliding window 204 (that is to say, use the corresponding coefficient of channel p of the second DPG kernel to perform weighted averaging operations for the six pieces of calibration data), with the fitting target being ghost-free target ACS data (as shown by the small gray point in line 1 of 23) in line 1 of 23, whose position is the same as that of calibration data in the intermediate position in the sliding window 203, and obtain a fitting equation after the fitting. The sliding windows 203, 204 slide on 22 and 21 sequentially from left to right and from the top to the bottom. Construct a fitting equation each time the sliding windows slide. After performing the above-mentioned procedure for all negative and positive readout gradient calibration data of all channels, solve all constructed fitting equations to obtain a matrix consisting of all coefficients, which is the second DPG kernel for final use.

After the first DPG kernel and the second DPG kernel are obtained, the first DPG kernel and the second DPG kernel can be adopted to correct phase errors of imaging data.

As shown in FIG. 2, 26 is a k-space representation of imaging data, obtained through accelerated EPI acquisitions, of channel p of an imaging target, and the acceleration factor in an intra-layer phase direction is R=2, as mentioned previously. The phase error correction process of imaging data is as follows:

Set two sliding windows 205, 206 with a length of n=3. The sliding step of the sliding windows 205, 206 is 1. The two sliding windows 205, 206 synchronously slide on positive readout gradient imaging data in line m (m≥1) of 26 and negative readout gradient imaging data in line m+1, respectively. As shown in FIG. 2, when the sliding window 205 slides to the position shown in line 1 of 25, the sliding window 205 contains three pieces of calibration data. Meanwhile, the sliding window 206 slides to the position shown in line 2 of 26, and at this time, the sliding window 206 also contains three pieces of calibration data. Adopt the first DPG kernel to perform weighted averaging operations for the six pieces of calibration data to obtain imaging data in line 1 of channel p, whose position is the same as that of the imaging data in the intermediate position in the sliding window 205. The sliding windows 205, 206 slide on 26 sequentially from left to right and from the top to the bottom. Perform a weighted averaging operation each time the sliding windows slide, until the imaging data of all positive readout gradient lines of channel p is obtained.

Meanwhile, set two sliding windows 207, 208 with a length of n=3. The sliding step of the sliding windows 207, 208 is 1. The two sliding windows 207, 208 synchronously slide on negative readout gradient imaging data in line m+1 (m≥1) of 26 and positive readout gradient imaging data in line m+2, respectively. As shown in FIG. 2, when the sliding window 207 slides to the position shown in line 2 of 26, the sliding window 207 contains three pieces of calibration data. Meanwhile, the sliding window 208 slides to the position shown in line 3 of 26, and at this time, the sliding window 208 also contains three pieces of calibration data. Adopt the second DPG kernel to perform weighted averaging operations for the six pieces of calibration data to obtain imaging data in line 2 of channel p, whose position is the same as that of imaging data in the intermediate position in the sliding window 207. The sliding windows 207, 208 slide on 26 sequentially from left to right and from the top to the bottom. Perform a weighted averaging operation each time the sliding windows slide, until the imaging data of all negative readout gradient lines of channel p is obtained.

It should be noted that imaging data in some positions, for example, the first and last imaging data in each line and imaging data in the last line, cannot be obtained through calculations in the above-mentioned process, and in this case, imaging data obtained through EPI acquisitions in corresponding positions can directly be used as imaging data in these positions. In FIG. 2, 27 is a k-space representation of imaging data after a phase error correction.

After obtaining imaging data of all channels of the imaging target, then adopt a parallel reconstruction method or a reconstruction method based on deep learning to estimate missing k-space lines of imaging data of all channels of the imaging target, and finally obtain phase-error-free and missing-k-space-line-free imaging data of the imaging target. In FIG. 2, 28 is a k-space representation of phase-error-free and missing-k-space-line-free imaging data.

Application examples of the present disclosure are given below:

1. Water Model Verification

In order to prove the validity of the method provided by embodiments of the present disclosure, prototype single-shot EPI diffusion weighted imaging sequences are adopted to perform accelerated EPI data acquisitions for a water model, wherein the acceleration factor in an intra-layer phase direction is R=2.

FIG. 3 is an example diagram of images obtained by adopting different methods to reconstruct acquired accelerated EPI data in a water model verification. Wherein:

Image a corresponds to a prior method. Specifically, first adopt the traditional NGC method to perform zero-order and first-order phase error corrections for acquired imaging data, and then adopt the GRAPPA-based reconstruction method to perform a missing k-space line estimation for the imaging data after the zero-order and first-order phase error corrections.

Image b corresponds to a prior method. Specifically, first adopt the traditional NGC method to perform zero-order and first-order phase error corrections for acquired imaging data, and then adopt the DPG method to perform a phase error correction and a missing k-space line estimation for the imaging data after the zero-order and first-order phase error corrections.

Image c corresponds to the method provided by embodiments of the present disclosure: First adopt the traditional NGC method to perform zero-order and first-order phase error corrections for acquired imaging data, then adopt the method provided by embodiments of the present disclosure to perform phase error corrections for imaging data after the zero-order and first-order phase error corrections, and finally adopt the GRAPPA-based reconstruction method to perform a missing k-space line estimation for phase-error-free imaging data.

Image d corresponds to a prior method. Specifically, first adopt the traditional NGC method to perform zero-order and first-order phase error corrections for acquired imaging data, and then adopt a reconstruction method based on deep learning to perform a missing k-space line estimation for the imaging data after the zero-order and first-order phase error corrections.

Image e corresponds to a method improved based on a prior method. Specifically, first adopt the traditional NGC method to perform zero-order and first-order phase error corrections for acquired imaging data, and then adopt a reconstruction method based on deep learning to perform a missing k-space line estimation for the imaging data after the zero-order and first-order phase error corrections, wherein the calibration data adopted for the deep learning network in the reconstruction method based on deep learning is the ghost-free target ACS data obtained after processing by use of the GESTE method.

Image f corresponds to the method provided by embodiments of the present disclosure: first adopt the traditional NGC method to perform zero-order and first-order phase error corrections for acquired imaging data, then adopt the method provided by embodiments of the present disclosure to perform phase error corrections for imaging data after the zero-order and first-order phase error corrections, and then adopt a reconstruction method based on deep learning to perform a missing k-space line estimation for phase-error-free imaging data.

From FIG. 3, it can be seen that since the DPG method is not adopted to process images a, d, and e, Nyquist ghosts, namely ghosts which arrows in images a, d, and e point to can be seen clearly, but no Nyquist ghost can be observed in images b, c, and f processed by use of the DPG method. Thus, the Nyquist ghost elimination effect is good since DPG kernels are adopted to perform phase error corrections in embodiments of the present disclosure. In addition, from the ghost which the arrows on the lower side of image d point to, and no ghost in corresponding positions in image e and image f, it can be seen that when the calibration data adopted for the deep learning network in the reconstruction method based on deep learning is ghost-free target ACS data, the ghost elimination effect is good.

2. In-Vivo Verification

All measurements in the present instance are performed on a 3T scanner equipped with a 20-channel head/neck coil. Prototype single-shot EPI blood oxygen on level depending (BOLD) sequences and prototype single-shot EPI diffusion weighted imaging sequences are adopted to obtain experiment data from healthy volunteers.

Figure 4:
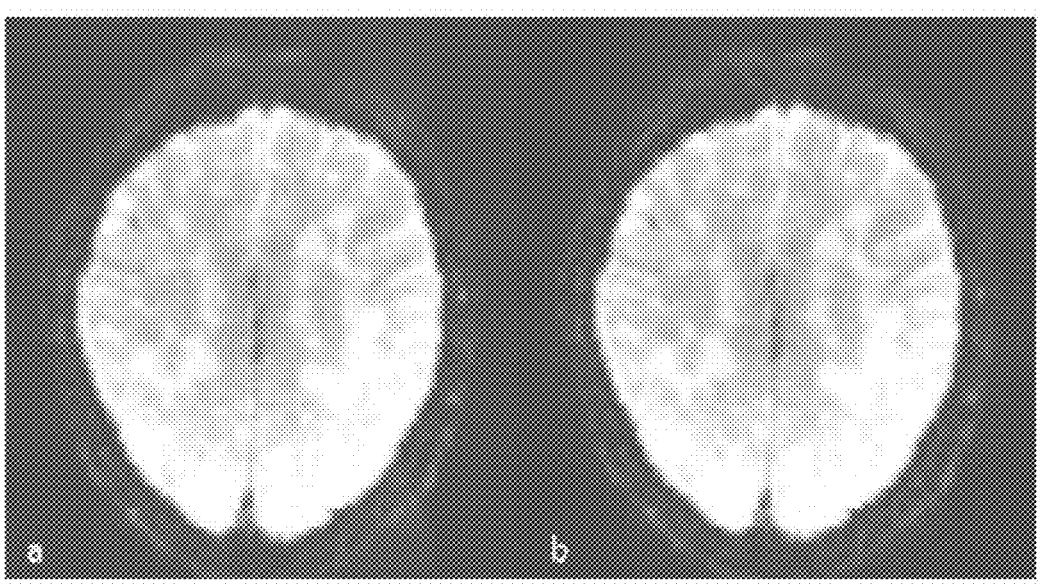
FIG. 4 illustrates an example diagram of images obtained by adopting different methods to reconstruct imaging data acquired by adopting prototype single-shot EPI BOD sequences in an in-vivo verification.

FIG. 4 is an example diagram of images obtained by adopting different methods to reconstruct imaging data acquired by adopting prototype single-shot EPI BOD sequences in an in-vivo verification, wherein, there is no acceleration in an intra-layer phase direction, and the layer acceleration factor is 4. Wherein:

Image a in FIG. 4 is a picture obtained by adopting a prior method to reconstruct acquired imaging data.

Image b in FIG. 4 is a picture obtained by adopting the method provided by embodiments of the present disclosure to reconstruct acquired imaging data.

From images a and b in FIG. 4, it can be seen that the Nyquist ghost in image a is obvious, but the Nyquist ghost in image b is reduced significantly.

Figure 5:
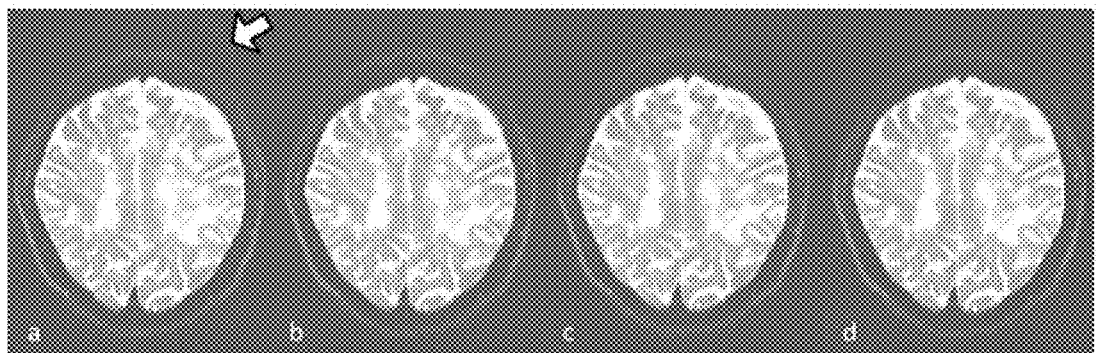
FIG. 5 illustrates an example diagram of images obtained by adopting different methods to reconstruct imaging data acquired by adopting prototype single-shot EPI diffusion weighted imaging sequences in an in-vivo verification provided by embodiments of the present disclosure.

FIG. 5 is an example diagram of images obtained by adopting different methods to reconstruct imaging data acquired by adopting prototype single-shot EPI diffusion weighted imaging sequences in an in-vivo verification, wherein, the acceleration factor in an intra-layer phase direction is R=2. Wherein:

Image a corresponds to a prior method. Specifically, first adopt the traditional NGC method to perform zero-order and first-order phase error corrections for acquired imaging data, and then adopt the GRAPPA-based reconstruction method to perform a missing k-space line estimation for the imaging data after the zero-order and first-order phase error corrections.

Image b corresponds to a prior method. Specifically, first adopt the traditional NGC method to perform zero-order and first-order phase error corrections for acquired imaging data, and then adopt the DPG method to perform a phase error correction and a missing k-space line estimation for the imaging data after the zero-order and first-order phase error corrections.

Image c corresponds to the method provided by embodiments of the present disclosure: First adopt the traditional NGC method to perform zero-order and first-order phase error corrections for acquired imaging data, then adopt the method provided by embodiments of the present disclosure to perform phase error corrections for imaging data after the zero-order and first-order phase error corrections, and finally adopt the GRAPPA-based reconstruction method to perform a missing k-space line estimation for phase-error-free imaging data.

Image d corresponds to the method provided by embodiments of the present disclosure: first adopt the traditional NGC method to perform zero-order and first-order phase error corrections for acquired imaging data, then adopt the method provided by embodiments of the present disclosure to perform phase error corrections for imaging data after the zero-order and first-order phase error corrections, and then adopt a reconstruction method based on deep learning to perform a missing k-space line estimation for phase-error-free imaging data.

From FIG. 5, it can be seen that since the DPG method is not adopted to process image a, Nyquist ghosts can be observed clearly; but no Nyquist ghost can be observed in image b, c, or d processed by use of the DPG method. Thus, it can be seen that the Nyquist ghost elimination effect is good since DPG kernels are adopted to perform phase error corrections in embodiments of the present disclosure.

Figure 6:
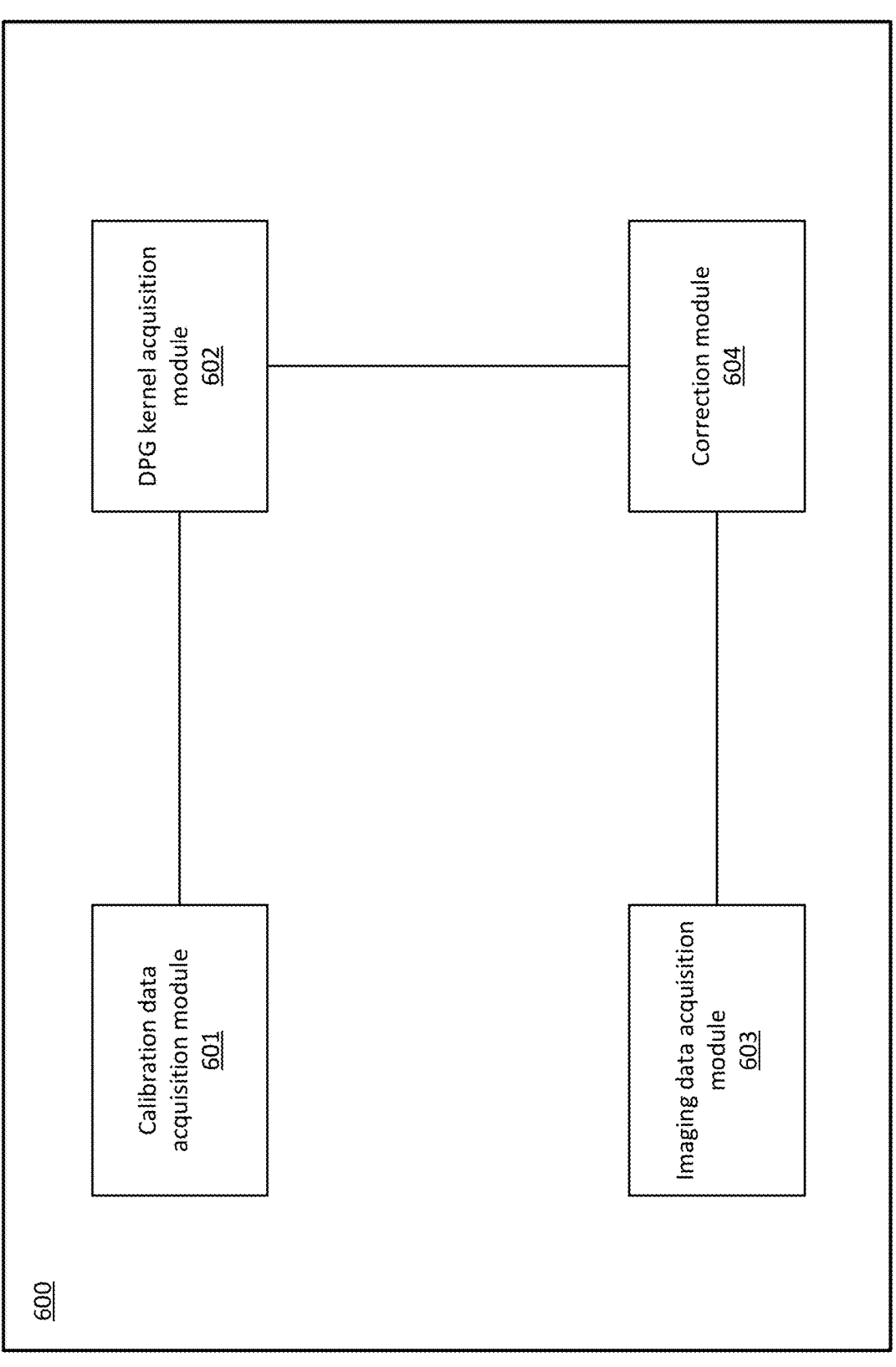
FIG. 6 illustrates the structure of the EPI data correction device provided by embodiments of the present disclosure.

FIG. 6 shows the structure of the EPI data correction device 600 provided by embodiments of the present disclosure, and the device 600 mainly comprises:

A calibration data acquisition module 601: configured to obtain positive readout gradient calibration data and negative readout gradient calibration data of an imaging target through non-accelerated EPI acquisitions;

A DPG kernel acquisition module 602, configured to adopt a first DPG kernel to be fitted and used to eliminate phase errors of positive readout gradients to fit positive readout gradient calibration data and negative readout gradient calibration data of the imaging target, with the fitting target being positive readout gradient target ACS data in ghost-free target ACS data, and obtain, after the fitting, the first DPG kernel for final use; adopt a second DPG kernel to be fitted and used to eliminate phase errors of negative readout gradients to fit negative readout gradient calibration data and positive readout gradient calibration data of the imaging target, with the fitting target being negative readout gradient target ACS data in ghost-free target ACS data, and obtain, after the fitting, the second DPG kernel for final use;

An imaging data acquisition module 603, configured to obtain imaging data of the imaging target through accelerated or non-accelerated EPI acquisitions;

A correction module 604, configured to adopt the first DPG kernel and the second DPG kernel for final use to correct phase errors of positive readout gradients and negative readout gradients of imaging data of the imaging target to obtain phase-error-free imaging data.

In an alternative embodiment, when the imaging data acquisition module 603 obtains imaging data of the imaging target through accelerated EPI acquisitions:

The above-mentioned device 600 further comprises a missing line estimation module, configured to perform missing k-space line estimation processing for the phase-error-free imaging data obtained by the correction module 604 to obtain phase-error-free and missing-k-space-line-free imaging data.

In an alternative embodiment, the missing line estimation module performing missing k-space line estimation processing for the phase-error-free imaging data obtained by the correction module 604 comprises: adopting a parallel reconstruction method or a reconstruction method based on deep learning to perform missing k-space line estimation processing for the phase-error-free imaging data.

In an alternative embodiment, when the parallel reconstruction method adopted by the missing line estimation module is a GRAPPA-based reconstruction method, the GRAPPA kernel adopted for the GRAPPA-based reconstruction method is obtained by fitting the ghost-free target ACS data, and when the parallel reconstruction method adopted by the missing line estimation module is a reconstruction method based on sensitivity encoding, the coil sensitivity map in the reconstruction method based on sensitivity encoding is obtained by adopting the ghost-free target ACS data for calculations.

In an alternative embodiment, when the missing line estimation module adopts the reconstruction method based on deep learning to perform missing k-space line estimation processing for the phase-error-free imaging data, calibration data adopted for the deep learning network in the reconstruction method based on deep learning is the ghost-free target ACS data.

In an alternative embodiment, the DPG kernel acquisition module 602 adopting a first DPG kernel to be fitted and used to eliminate phase errors of positive readout gradients to fit positive readout gradient calibration data and negative readout gradient calibration data of the imaging target comprises:

performing the following step A1 for positive readout gradient calibration data and negative readout gradient calibration data of each channel of the imaging target:

A1: set two sliding windows with a length of n and a sliding step of 1, and synchronously slide the two sliding windows on positive readout gradient calibration data in line m of the current channel and negative readout gradient calibration data in line m+R; when the positions of the two sliding windows are changed, adopt the coefficient of the corresponding channel of the first DPG kernel to fit 2n pieces of data in the two sliding windows, and obtain a fitting equation after the fitting, wherein n is an integer greater than 1, m is an integer greater than or equal to 1, and R is an acceleration factor in an intra-layer phase direction;

after performing step A1 for positive readout gradient calibration data and negative readout calibration data of all channels of the imaging target, solve all fitting equations to obtain all coefficients of all channels of the first DPG kernel.

In an alternative embodiment, the DPG kernel acquisition module 602 adopting a second DPG kernel to be fitted and used to eliminate phase errors of negative readout gradients to fit negative readout gradient calibration data and positive readout gradient calibration data of the imaging target comprises:

performing the following step A2 for negative readout gradient calibration data and positive readout gradient calibration data of each channel of the imaging target:

A2: set two sliding windows with a length of n and a sliding step of 1, and synchronously slide the two sliding windows on negative readout gradient calibration data in line m of the current channel and positive readout gradient calibration data in line m+R; when the positions of the two sliding windows are changed, adopt the coefficient of the corresponding channel of the second DPG kernel to fit 2n pieces of data in the two sliding windows, with the fitting target being data in the corresponding position in line m in ghost-free target ACS data of the corresponding channel, and obtain a fitting equation after the fitting, wherein n is an integer greater than 1, m is an integer greater than or equal to 1, and R is an acceleration factor in an intra-layer phase direction;

after performing step A2 for negative readout gradient calibration data and positive readout calibration data of all channels of the imaging target, solve all fitting equations to obtain all coefficients of all channels of the second DPG kernel.

In an alternative embodiment, the correction module 604 adopting the first DPG kernel and the second DPG kernel for final use to correct phase errors of positive readout gradients and negative readout gradients of the imaging target comprises:

performing the following steps B1 and B2 for imaging data of each channel of the imaging target:

B1: set two sliding windows with a length of n and a sliding step of 1, and synchronously slide the two sliding windows on positive readout gradient imaging data in line m of the current channel and negative readout gradient imaging data in line m+1; when the positions of the two sliding windows are changed, adopt the first DPG kernel for final use to perform weighted averaging operations for 2n pieces of data in the two sliding windows to obtain ghost-free imaging data in the corresponding position in line m of the corresponding channel, wherein n is an integer greater than 1 and m is an integer greater than or equal to 1;

B2: set two sliding windows with a length of n and sliding step of 1, and synchronously slide the two sliding windows on negative readout gradient imaging data in line m+1 of the current channel and positive readout gradient imaging data in line m+2; when the positions of the two sliding windows are changed, adopt the second DPG kernel for final use to perform weighted averaging operations for 2n pieces of data in the two sliding windows to obtain ghost-free data in the corresponding position in line m+1 of the corresponding channel;

after performing steps B1 and B2 for imaging data of all channels of the imaging target, obtain ghost-free imaging data of all channels of the imaging target.

In an alternative embodiment, the device 600 further comprises a ghost-free calibration data acquisition module, configured to perform phase error elimination processing for positive readout gradient calibration data and negative readout gradient calibration data of the imaging target to obtain ghost-free target ACS data.

In an alternative embodiment, the ghost-free calibration data acquisition module performing phase error elimination processing for positive readout gradient calibration data and negative readout gradient calibration data of the imaging target comprises: adopting the GESTE method to perform phase error elimination processing for positive readout gradient calibration data and negative readout gradient calibration data of the imaging target.

Embodiments of the present disclosure further provide an MRI system and the MRI system comprises the EPI data correction device 600 provided by embodiments of the present disclosure.

The embodiments of the present disclosure have the following beneficial technical effects:

1. The DPG kernels used to correct phase errors of positive and negative readout gradients can be obtained through fitting, and the DPG kernels can correct not only zero-order and first-order phase errors, but also high-order phase errors.

2. Phase errors of acquired EPI data are first corrected, and then missing k-space lines are estimated. The method provided by the present disclosure can flexibly be compatible with various EPI reconstruction scenarios, for example, parallel reconstructions and reconstructions based on deep learning.

3. Only two DPG kernels respectively used for positive and negative readout gradients are required, without any necessity of considering the acceleration factor. Therefore, when the method provided by the present disclosure is combined with the GRAPPA-based reconstruction method, a smaller total number of kernels is required. For example, when the acceleration factor in an intra-layer phase direction is 3, four kernels are required in total if the embodiments of the present disclosure are adopted, wherein, two DPG kernels are used to correct phase errors of positive and negative readout gradients, respectively, and the other two GRAPPA kernels are used to estimate missing k-space lines. However, for the prior DPG method, six DPG kernels are required in total to correct phase errors and estimate missing k-space lines.

4. In embodiments of the present disclosure, DPG kernels are independent GRAPPA kernels, and thus the size of DPG kernels is not restricted by GRAPPA kernels and can be applied more flexibly.

Those skilled in the art can understand that features stated in embodiments and/or claims of the present disclosure can be combined and/or integrated, even if such combinations or integrations are not clearly stated in the present application. Specially, without departing from the spirit and teaching of the present application, features stated in embodiments and/or claims of the present application can be combined and/or integrated, and all these combinations and/or integrations fall within the scope of protection of the present application.

Specific embodiments are given to describe the principle and implementation modes of the present application in the document, and the description of those embodiments is used only to help understand the method and the core idea of the present application, but not used to restrict the present application. Those skilled in the art can make changes in specific implementation modes and the application scope according to the idea, spirit and principle of the present application, and any modification, equivalent replacement or improvement should fall within the scope of protection of the present application.

The various components described herein may be referred to as "modules." Such components may be implemented via any suitable combination of hardware and/or software components as applicable and/or known to achieve their intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer-readable medium. Regardless of the particular implementation, such modules, as applicable and relevant, may alternatively be referred to herein as "circuitry," "controllers," "processors," or "processing circuitry," or alternatively as noted herein.

What is claimed is:

1. An echo planar imaging (EPI) data correction method, comprising:

obtaining positive readout gradient calibration data and negative readout gradient calibration data of an imaging target via non-accelerated EPI acquisitions;

implementing a first Dual-Polarity (DP) GeneRalized Auto-Calibrating Partially Parallel Acquisition (GRAPPA) (DPG) kernel to be fitted and used to eliminate a phase error of a positive readout gradient to fit the positive readout gradient calibration data and the negative readout gradient calibration data of the imaging target, with a first fitting target being positive readout gradient target auto-calibration signal (ACS) data in ghost-free target ACS data;

obtaining, after fitting the first DPG kernel, a first DPG kernel for final use;

implementing a second DPG kernel to be fitted and used to eliminate phase errors of negative readout gradients to fit the negative readout gradient calibration data and positive readout gradient calibration data of the imaging target, with a second fitting target being negative readout gradient target ACS data in ghost-free target ACS data;

obtaining, after fitting the second DPG kernel, a second DPG kernel for final use;

obtaining imaging data of the imaging target via accelerated or non-accelerated EPI acquisitions; and implementing the first DPG kernel for final use and the second DPG kernel for final use to correct phase errors of positive readout gradients and negative readout gradients for imaging data of the imaging target to obtain phase-error-free imaging data.

2. The method as claimed in claim 1, further comprising:

when imaging data of the imaging target obtained through accelerated or non-accelerated EPI acquisitions is obtained via accelerated EPI acquisitions, after obtaining the phase-error-free imaging data:

performing missing k-space line estimation processing for the phase-error-free imaging data to obtain phase-error-free and missing-k-space-line-free imaging data.

3. The method as claimed in claim 2, wherein performing the missing k-space line estimation processing comprises:

implementing a parallel reconstruction method or a reconstruction method based on deep learning to perform the missing k-space line estimation processing.

4. The method as claimed in claim 3, wherein:

when the parallel reconstruction method is a GRAPPA-based reconstruction method, a GRAPPA kernel implementing for the GRAPPA-based reconstruction method is obtained by fitting the ghost-free target ACS data; and when the parallel reconstruction method comprises a reconstruction method based on sensitivity encoding, a coil sensitivity map in the reconstruction method based on sensitivity encoding is obtained by implementing the ghost-free target ACS data for calculations.

5. The method as claimed in claim 3, wherein when the reconstruction method based on deep learning is implemented to perform missing k-space line estimation processing for the phase-error-free imaging data, calibration data implemented for the deep learning network in the reconstruction method based on deep learning comprises the ghost-free target ACS data.

6. The method as claimed in claim 1, wherein implementing the first DPG kernel comprises:

performing, for positive readout gradient calibration data and negative readout gradient calibration data of each channel of the imaging target:

A1:

set two sliding windows with a length of n and a sliding step of 1, and synchronously slide the two sliding windows on positive readout gradient calibration data in a line m of a current channel and negative readout gradient calibration data in a line m+R;

when the positions of the two sliding windows are changed, implementing a coefficient of the corresponding channel of the first DPG kernel to fit 2n pieces of data in the two sliding windows; and obtain a fitting equation after fitting the first DPG kernel, wherein:

n represents an integer greater than 1, m represents an integer greater than or equal to 1, and R represents an acceleration factor in an intra-layer phase direction; and after performing step A1 for positive readout gradient calibration data and negative readout calibration data of all channels of the imaging target, solve all fitting equations to obtain all coefficients of all channels of the first DPG kernel.

7. The method as claimed in claim 1, wherein implementing the second DPG kernel comprises:

performing, for negative readout gradient calibration data and positive readout gradient calibration data of each channel of the imaging target:

A2:

set two sliding windows with a length of n and a sliding step of 1, and synchronously slide the two sliding windows on negative readout gradient calibration data in a line m of a current channel and positive readout gradient calibration data in a line m+R;

when the positions of the two sliding windows are changed, implement a coefficient of the corresponding channel of the second DPG kernel to fit 2n pieces of data in the two sliding windows, with the second fitting target being data in the corresponding position in line m in ghost-free target ACS data of the corresponding channel; and obtain a fitting equation after fitting the second DPG kernel, wherein:

n represents an integer greater than 1, m represents an integer greater than or equal to 1, and R represents an acceleration factor in an intra-layer phase direction; and after performing step A2 for negative readout gradient calibration data and positive readout calibration data of all channels of the imaging target, solve all fitting equations to obtain all coefficients of all channels of the second DPG kernel.

8. The method as claimed in claim 1, wherein implementing the first DPG kernel and the second DPG kernel for final use comprises:

performing, for imaging data of each channel of the imaging target:

B1:

set two sliding windows with a length of n and a sliding step of 1, and synchronously slide the two sliding windows on positive readout gradient imaging data in a line m of a current channel and negative readout gradient imaging data in a line m+1;

when the positions of the two sliding windows are changed, implement the first DPG kernel for final use to perform weighted averaging operations for 2n pieces of data in the two sliding windows to obtain ghost-free imaging data in the corresponding position in line m of the corresponding channel;

B2:

set two sliding windows with a length of n and sliding step of 1, and synchronously slide the two sliding windows on negative readout gradient imaging data in a line m+1 of a current channel and positive readout gradient imaging data in a line m+2;

when the positions of the two sliding windows are changed, implement the second DPG kernel for final use to perform weighted averaging operations for 2n pieces of data in the two sliding windows to obtain ghost-free data in the corresponding position in line m+1 of the corresponding channel;

wherein n represents an integer greater than 1 and m represents an integer greater than or equal to 1, and after performing steps B1 and B2 for imaging data of all channels of the imaging target, obtain ghost-free imaging data of all channels of the imaging target.

9. The method as claimed in claim 1, further comprising:

(i) after obtaining positive readout gradient calibration data and negative readout calibration data of the imaging target through non-accelerated EPI acquisitions, and (ii) before implementing a first DPG kernel to be fitted and used to eliminate phase errors of positive readout gradients to fit positive readout gradient calibration data and negative readout gradient calibration data of the imaging target;

performing phase error elimination processing for positive readout gradient calibration data and negative readout gradient calibration data of the imaging target to obtain ghost-free target ACS data.

10. The method as claimed in claim 9, wherein performing the phase error elimination processing comprises:

implementing ghost elimination via a spatial and temporal encoding (GESTE) method to perform the phase error elimination processing.

11. An echo planar imaging (EPI) data correction device, comprising:

calibration data acquisition circuitry configured to obtain positive readout gradient calibration data and negative readout gradient calibration data of an imaging target via non-accelerated EPI acquisitions;

DPG kernel acquisition circuitry configured to:

implement a first DPG kernel to be fitted and used to eliminate phase errors of positive readout gradients to fit positive readout gradient calibration data and negative readout gradient calibration data of the imaging target, with a first fitting target being positive readout gradient target auto-calibration signal (ACS) data in ghost-free target ACS data;

obtain, after fitting the first DPG kernel, a first DPG kernel for final use;

implement a second DPG kernel to be fitted and used to eliminate phase errors of negative readout gradients to fit negative readout gradient calibration data and positive readout gradient calibration data of the imaging target, with a second fitting target being negative readout gradient target ACS data in ghost-free target ACS data; and obtain, after fitting the second DPG kernel, a second DPG kernel for final use;

imaging data acquisition circuitry configured to obtain imaging data of the imaging target via accelerated or non-accelerated EPI acquisitions; and correction circuitry configured to implement the first DPG kernel for final use and the second DPG kernel for final use to correct phase errors of positive readout gradients and negative readout gradients of imaging data of the imaging target to obtain phase-error-free imaging data.

12. The device as claimed in claim 11, further comprising: missing line estimation circuitry, wherein when the imaging data acquisition circuitry obtains the imaging data of the imaging target via accelerated EPI acquisitions, the missing line estimation circuitry is configured to perform missing k-space line estimation processing for the phase-error-free imaging data to obtain phase-error-free and missing-k-space-line-free imaging data.

13. The device as claimed in claim 12, wherein the missing line estimation circuitry is configured to perform the missing k-space line estimation processing by implementing a parallel reconstruction method or a reconstruction method based on deep learning to perform the missing k-space line estimation processing.

14. The device as claimed in claim 13, wherein when the parallel reconstruction method implemented by the missing line estimation circuitry comprises a GRAPPA-based reconstruction method, a GRAPPA kernel implemented for the GRAPPA-based reconstruction method is obtained by fitting the ghost-free target ACS data, and wherein when the parallel reconstruction method implemented by the missing line estimation circuitry comprises a reconstruction method based on sensitivity encoding, a coil sensitivity map in the reconstruction method based on sensitivity encoding is obtained by implementing the ghost-free target ACS data for calculations.

15. The device as claimed in claim 13, wherein when the missing line estimation circuitry implements the reconstruction method based on deep learning to perform missing k-space line estimation processing for the phase-error-free imaging data, calibration data implemented for the deep learning network in the reconstruction method based on deep learning comprises the ghost-free target ACS data.

16. The device as claimed in claim 11, wherein the DPG kernel acquisition circuitry implementing the first DPG kernel comprises:

performing, for positive readout gradient calibration data and negative readout gradient calibration data of each channel of the imaging target:

A1:

set two sliding windows with a length of n and a sliding step of 1, and synchronously slide the two sliding windows on positive readout gradient calibration data in a line m of a current channel and negative readout gradient calibration data in a line m+R;

when the positions of the two sliding windows are changed, implementing a coefficient of the corresponding channel of the first DPG kernel to fit 2n pieces of data in the two sliding windows; and obtain a fitting equation after fitting the first DPG kernel, wherein:

n represents an integer greater than 1, m represents an integer greater than or equal to 1, and R represents an acceleration factor in an intra-layer phase direction; and after performing step A1 for positive readout gradient calibration data and negative readout calibration data of all channels of the imaging target, solve all fitting equations to obtain all coefficients of all channels of the first DPG kernel.

17. The device as claimed in claim 11, wherein the DPG kernel acquisition circuitry implementing the second DPG kernel comprises:

performing, for negative readout gradient calibration data and positive readout gradient calibration data of each channel of the imaging target:

A2:

set two sliding windows with a length of n and a sliding step of 1, and synchronously slide the two sliding windows on negative readout gradient calibration data in a line m of a current channel and positive readout gradient calibration data in a line m+R;

when the positions of the two sliding windows are changed, implementing a coefficient of the corresponding channel of the second DPG kernel to fit 2n pieces of data in the two sliding windows, with the second fitting target being data in the corresponding position in line m in ghost-free target ACS data of the corresponding channel, and obtain a fitting equation after fitting the second DPG kernel, wherein:

n represents an integer greater than 1, m represents an integer greater than or equal to 1, and R represents an acceleration factor in an intra-layer phase direction; and after performing step A2 for negative readout gradient calibration data and positive readout calibration data of all channels of the imaging target, solve all fitting equations to obtain all coefficients of all channels of the second DPG kernel.

18. The device as claimed in claim 11, wherein the correction circuitry is configured to implement the first DPG kernel and the second DPG kernel for final use by:

performing, for imaging data of each channel of the imaging target:

B1:

set two sliding windows with a length of n and a sliding step of 1, and synchronously slide the two sliding windows on positive readout gradient imaging data in a line m of a current channel and negative readout gradient imaging data in a line m+1;

when the positions of the two sliding windows are changed, implementing the first DPG kernel for final use to perform weighted averaging operations for 2n pieces of data in the two sliding windows to obtain ghost-free imaging data in the corresponding position in line m of the corresponding channel;

B2:

set two sliding windows with a length of n and sliding step of 1, and synchronously slide the two sliding windows on negative readout gradient imaging data in a line m+1 of a current channel and positive readout gradient imaging data in a line m+2;

when the positions of the two sliding windows are changed, implementing the second DPG kernel for final use to perform weighted averaging operations for 2n pieces of data in the two sliding windows to obtain ghost-free data in the corresponding position in line m+1 of the corresponding channel, wherein n represents an integer greater than 1 and m represents an integer greater than or equal to 1; and after performing steps B1 and B2 for imaging data of all channels of the imaging target, obtain ghost-free imaging data of all channels of the imaging target.

19. The device as claimed in claim 11, further comprising:

ghost-free calibration data acquisition circuitry configured to perform phase error elimination processing for positive readout gradient calibration data and negative readout gradient calibration data of the imaging target to obtain ghost-free target ACS data.

20. The device as claimed in claim 19, wherein the ghost-free calibration data acquisition circuitry is configured to perform the phase error elimination processing by implementing ghost elimination via a spatial and temporal encoding (GESTE) method to perform the phase error elimination processing.

21. The device as claimed in claim 11, wherein the device is part of a magnetic resonance imaging (MRI) system.

* * * * *